United States Patent [19]

Miyazaki et al.

[11] Patent Number: 5,442,134
[45] Date of Patent: Aug. 15, 1995

[54] LEAD STRUCTURE OF SEMICONDUCTOR DEVICE

[75] Inventors: Yukiyasu Miyazaki, Kariya; Nobuyoshi Sugitani, Toyota; Yoshiaki Shimojo, Kagoshima, all of Japan

[73] Assignees: Kabushiki Kaisha Toyoda Jidoshokki Seisakusho, Kariya; Toyota Jidosha Kabushiki Kaisha, Aichi; Kyocera Corporation, Kyoto, all of Japan

[21] Appl. No.: 347,832

[22] Filed: Dec. 1, 1994

Related U.S. Application Data

[63] Continuation of Ser. No. 109,321, Aug. 19, 1993, abandoned.

[30] Foreign Application Priority Data

Aug. 20, 1992 [JP] Japan .................. 4-221825

[51] Int. Cl.⁶ ............................................. H01L 23/02
[52] U.S. Cl. .................. 174/52.4; 174/50.55; 361/772
[58] Field of Search ............ 174/52.1, 52.2, 52.3, 174/52.4, 50.6, 50.56, 50.52, 50.55; 361/718–720, 722, 723, 741, 772; 29/842, 843

[56] References Cited

U.S. PATENT DOCUMENTS

| | | | |
|---|---|---|---|
| 3,549,784 | 12/1970 | Hargis | 174/68.5 |
| 3,585,272 | 6/1971 | Shatz | 174/52.3 |
| 3,730,969 | 5/1973 | Buttle et al. | 174/52.4 |
| 3,846,825 | 11/1974 | Budde | 257/697 |
| 4,420,877 | 12/1983 | McKenzie, Jr. | 29/843 X |
| 4,785,137 | 11/1988 | Samuels | 439/887 X |
| 4,791,075 | 12/1988 | Lin | 174/50.51 X |
| 4,823,234 | 4/1989 | Konishi et al. | 174/52.2 X |
| 4,861,944 | 8/1989 | Jones, II et al. | 174/50.6 X |
| 4,872,844 | 10/1989 | Grebe et al. | 439/69 |
| 4,890,155 | 12/1989 | Miyagawa et al. | 357/74 |
| 4,949,225 | 8/1990 | Sagisaua et al. | 361/792 |
| 5,126,818 | 6/1992 | Takami et al. | 357/68 |
| 5,285,106 | 2/1994 | Deie | 174/52.4 X |
| 5,309,322 | 5/1994 | Wagner et al. | 361/723 |

FOREIGN PATENT DOCUMENTS

| | | |
|---|---|---|
| 2244656 | 5/1977 | Germany . |
| 62-23087 | 2/1987 | Japan . |
| 63-146973 | 9/1988 | Japan . |
| 1273342 | 11/1989 | Japan . |
| 2164057 | 6/1990 | Japan . |
| 2224363 | 9/1990 | Japan . |
| 2-132960 | 11/1990 | Japan . |
| 395962 | 4/1991 | Japan . |
| 4164358 | 6/1992 | Japan . |
| 555439 | 3/1993 | Japan . |

*Primary Examiner*—Leo P. Picard
*Assistant Examiner*—Christopher Horgan
*Attorney, Agent, or Firm*—Brooks Haidt Haffner & Delahunty

[57] ABSTRACT

Disclosed is a semiconductor device such as a DIP (Dual In-line Package) or PGA (Pin Grid Alley), which has a plurality of leads protruding only from one surface of a flat package. A single independent lead protrudes from the surface of the package at the position which is aligned with a guide hole formed in the package. The independent lead has a bore which penetrates through the lead lengthwise and connects to the guide hole. A wiring member of an electronic part or the like placed in the bore via the guide hole is soldered to the inner wall of the independent terminal.

9 Claims, 5 Drawing Sheets

LEAD STRUCTURE OF SEMICONDUCTOR DEVICE

This application is a continuation of application Ser. No. 08/109,321, filed Aug. 19, 1993 is now abandoned.

BACKGROUND OF THE INVENTION

1. Field of the Invention

The present invention relates to a semiconductor device, and, more particularly, to a semiconductor device having leads protruding from only one surface of a flat package, such as a PGA (Pin Grid Alley) or DIP (Dual In-line Package).

2. Description of the Related Art

Semiconductor devices of the PGA and DIP types have leads arranged along only one surface of the package, making their mount on printed circuit boards easier, and are thus popular today. To make the package of this type of semiconductor device smaller, a plurality of leads 103 are arranged close to one another on the bottom of the package 101, as shown in FIG. 6. The leads 103 are inserted in holes in a printed circuit board (PCB) 120 and are soldered to the printed circuit. Thereafter, the leads of other electronic parts or the like are soldered to the printed circuit.

As the number of the leads 103 of the device increases, the number of printed circuits increases accordingly, increasing the area of the PCB 120. This naturally requires greater space to accommodate the PCB 120, enlarging the general PCB assembly.

The semiconductor device disclosed in Japanese unexamined utility Model Publication No. 23087/1987 has an IC socket situated between a PCB and the semiconductor device. This IC socket has leads for connection to the PCB and leads for connection to other electronic parts. This design requires no intervention of the PCB to connect a PGA to the other electronic parts.

In this case too, the PCB assembly is enlarged by the space of the IC socket.

SUMMARY OF THE INVENTION

It is therefore a primary object of the present invention to provide a semiconductor device which has leads protruding from only one surface, such as a DIP or a PGA, and can ensure a compact assembly when connected to other electronic parts.

It is another object of this invention to provide a semiconductor device which is firmly connectable to the leads of other electronic parts or the like.

To achieve the foregoing and other objects, the present invention is directed to a lead structure of a semiconductor device to which a wiring member of an electronic part is to be connected, the lead structure comprising in a flat semiconductor package; a through hole formed in the semiconductor package: and a lead electrode protruding from the semiconductor package at a position aligned with the through hole.

DETAILED DESCRIPTION OF THE PREFERRED EMBODIMENTS

Figure 1:
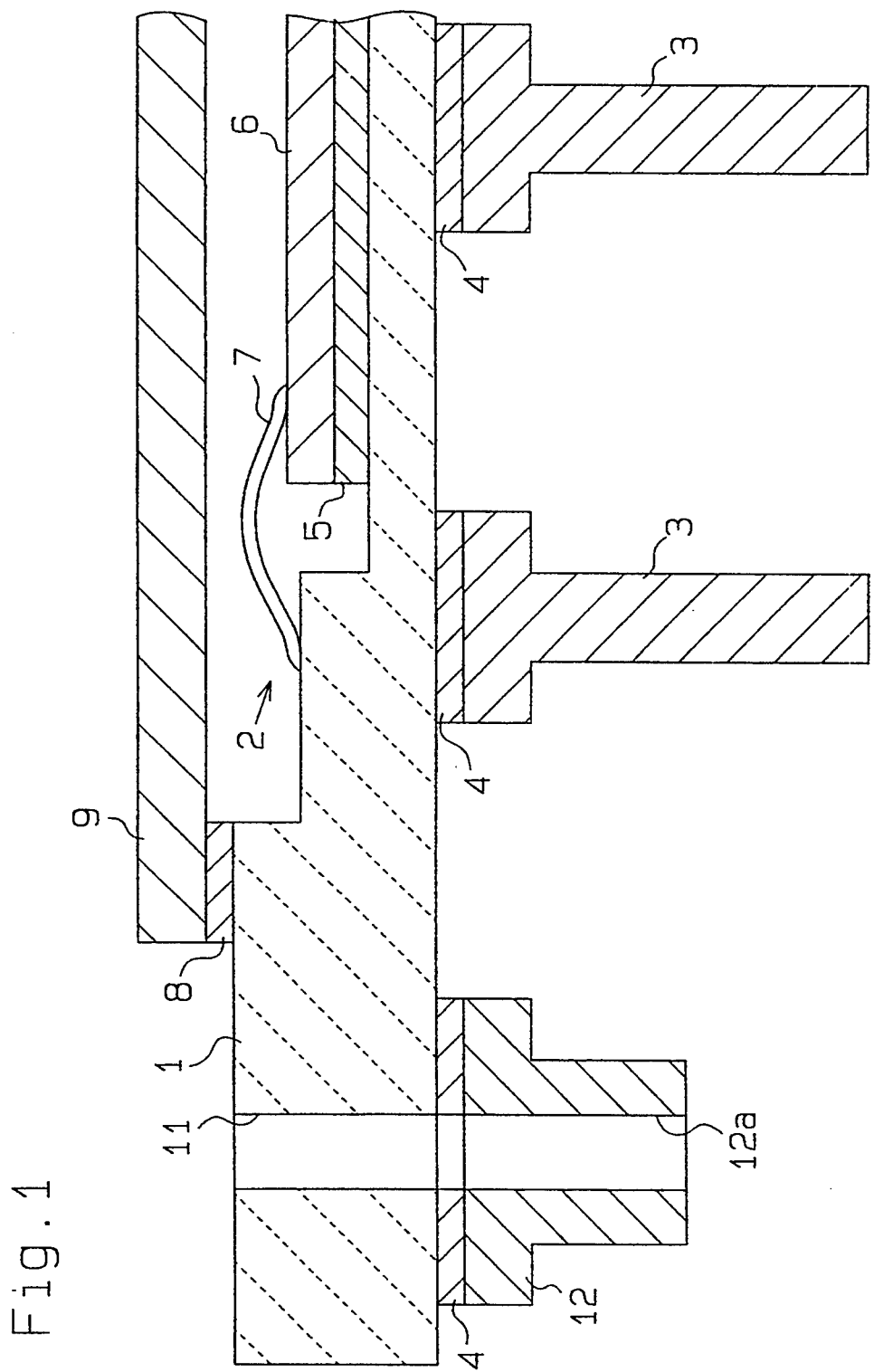
FIG. 1 is a cross section of a semiconductor device according to a first embodiment of the present invention.

In FIG. 1, a cavity 2 is formed on the top of a PGA type ceramic package 1. A semiconductor device 6 is adhered via a connect layer 5 to the bottom of the cavity 2. A plurality of lead pins 3 protruding from the bottom of the package 1 are connected to a lead frame, i.e., a printed circuit (not shown) provided in the package 1. An end portion exposed in the cavity 2 is connected to the semiconductor device 6 by bonding wires 7. A cap 9 is adhered by seal member 8, such as Ag-paste or solder, to the top of the package 1 in association with the cavity 2, shielding the cavity 2.

A through hole 11 is formed in that portion of the package 1 which is spaced apart from the cavity 2. The cap 9 has a size to cover only the cavity 2, and the through hole 11 is located outside the cap 9. A metal cylindrical lead connector 12 is brazed with a brazing filler metal 4 to the bottom of the package 1 at the position corresponding to the through hole 11. The lead connector 12, like the lead pins 3, is connected via a lead to the semiconductor device 6.

A flange is formed at the upper end portion of the lead connector 12 so that the adhesive area to the package is large. The lead connector 12 has a bore 12a having the same diameter as the through hole 11 of the package 1. The brazing filler metal 4 for coupling the lead connector 12 to the package 1 has a hole bored through, which has the same diameter as the bore 12a and the through hole 11. Accordingly, the through hole 11 and the bore 12a are connected vertically. The lead connector 12 is formed shorter than the lead pins 3.

Figure 2:
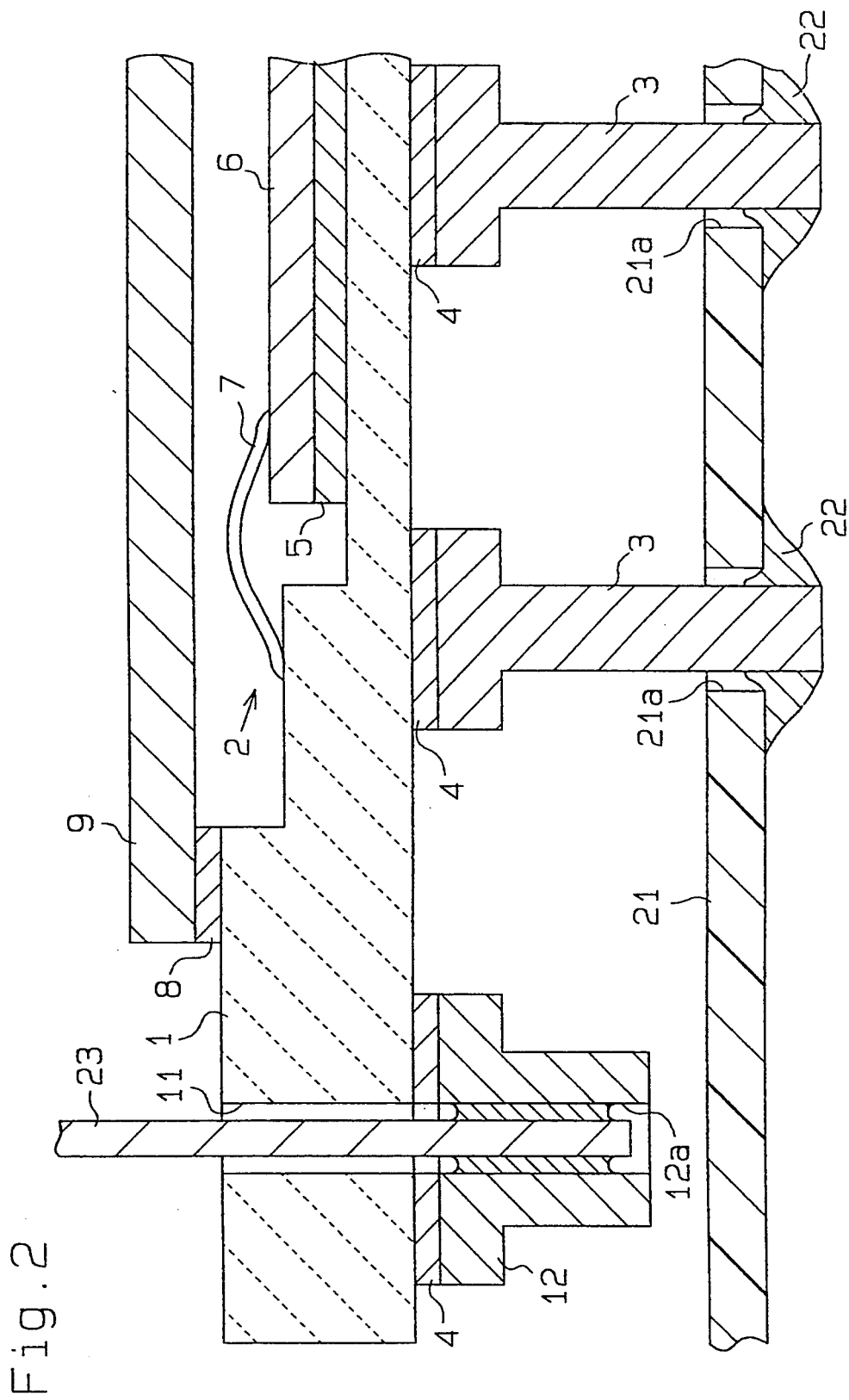
FIG. 2 is a cross section illustrating an assembly in which the semiconductor device shown in FIG. 1 is mounted on a PCB and is connected to a wiring member.

As shown in FIG. 2, the individual lead pins 3 are inserted in bores 21a formed in a printed circuit board 21 and are securely connected thereto by solder 22. As shown, the lead connector 12 will not contact the printed circuit board 21.

A wiring member 23 is inserted into the through hole 11 and the bore 12a from the upper surface of the package 1, and is brazed to the inner wall of the bore 12a. The wiring member 23 is therefore connected to the semiconductor device 6 via the lead connector 12. This can eliminate the need for a structure which connects the wiring member via the printed circuit board 21 to the semiconductor device 6.

According to this embodiment, the material of the package 1 is alumina, PZT (essentially consisting of lead, zirconium and titanium), mullite, alumina nitride or the like. The material for the connect layer 5 and seal member 8 is a brazing filler metal, such as an Ag paste or solder, or an epoxy resin.

Since the wiring member 23 is first inserted in the through hole 11 and the bore 12a and is then connected to the inner wall of the bore 12a by brazing, the attachment is firmer as compared with the case where brazing is made on the outer surface of the lead connector 12. Even with external force applied to the wiring member 23, therefore, the wiring member 23 is prevented from being separated from the lead connector 12. The wiring member 23 may be replaced with a lead of another electronic part.

According to this embodiment, wiring is accomplished on the top and bottom of the package 1 via the lead connector 12 and the lead pins 3. The wiring efficiency therefore increases while reducing the wiring space.

Figure 3:
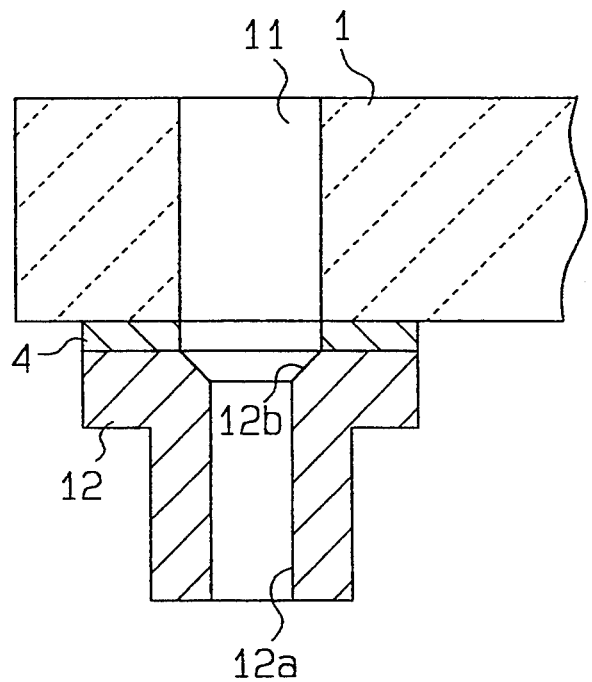
FIG. 3 is a cross section of a semiconductor device according to a second embodiment of this invention.

A second embodiment of this invention will now be described referring to FIG. 3.

In this embodiment, the through hole 11 in the package 1 is formed larger than the bore 12a of the lead 12, and a funnel portion 12b is formed at the upper end portion of the bore 12a. The upper edge of the funnel portion 12b has the same diameter as the through hole 11.

With the above structure, even if the relative position of the bore 12a to the through hole 11 is slightly shifted, sufficient connection between the through hole 11 and the bore 12a is still assured. At the time of attaching the lead 12 to the package 1, therefore, the accuracy of the relative position of both through hole 11 and bore 12a does not matter so much, resulting in simpler manufacturing procedures.

Further, with the through hole 11 and the bore 12a precisely aligned with each other, the wiring member 23 or another lead inserted through the larger-diameter through hole 11 smoothly reaches inside the bore 12a along the tapered inner wall of the funnel portion 12b. This facilitates the attachment of the wiring member 23.

Figure 4:
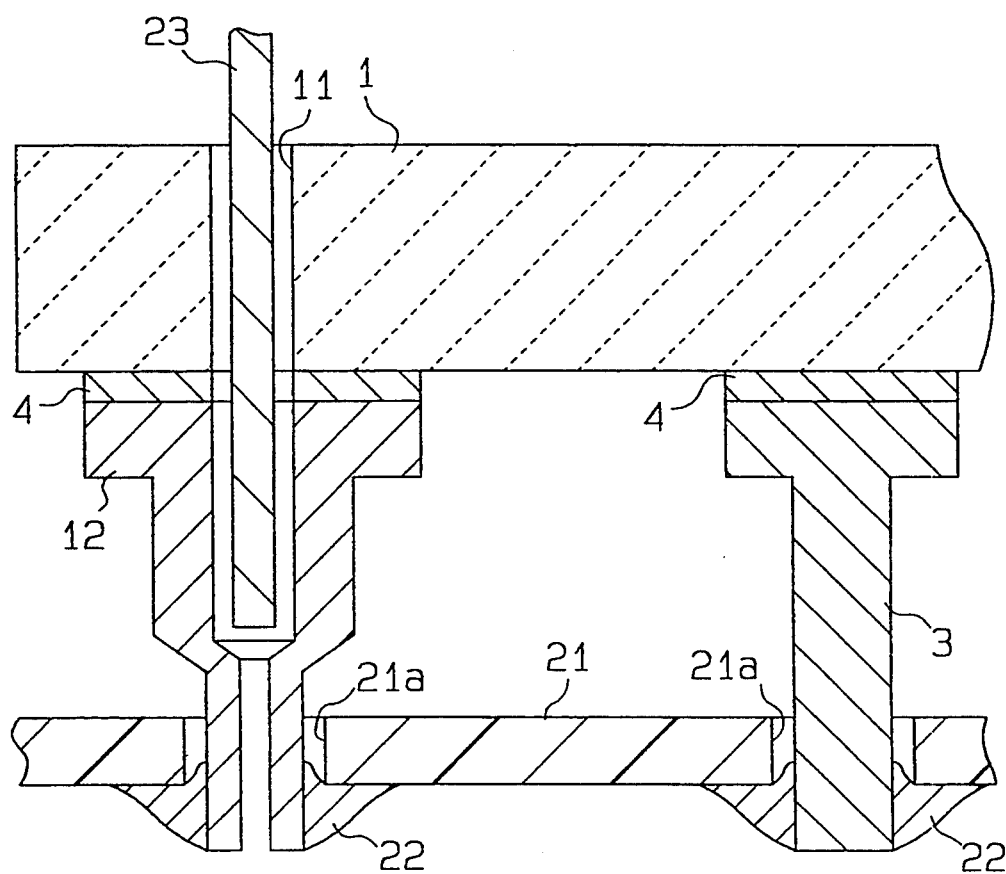
FIG. 4 is a cross section illustrating an assembly comprising a semiconductor device according to a third embodiment of this invention and a PCB.

FIG. 4 illustrates a third embodiment of this invention.

In this embodiment, the lead 12 has the same length as the lead pins 3. The lower end portion of the lead 12 has a diameter equal to that of the lead pins 3. The lead 12, like the lead pins 3, is inserted in the associated bore 21a in the printed circuit board 21 and is firmly soldered to the inner wall of the respective bore 21a.

This structure permits the lead 12 to contact both the printed circuitry on the printed circuit board 21 in addition to the wiring of the wiring member 23 from the top of the package 1 as in the first embodiment. This further improves the wiring efficiency.

As the cylindrical lead 12 as well as the lead pins 3 are brazed to the printed circuit board 21, the package 1 is firmly secured to the board 21.

Figure 5:
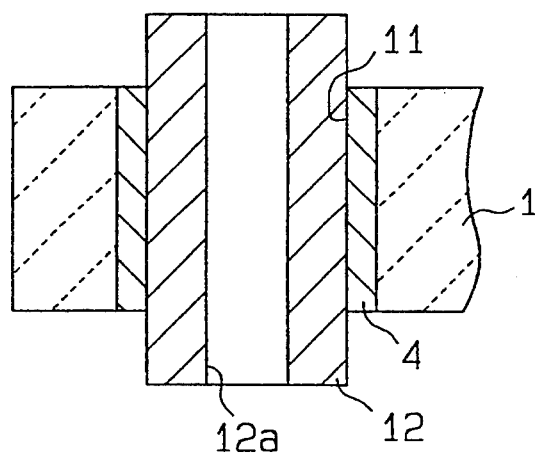
FIG. 5 is a cross section of a part of a semiconductor device according to a fourth embodiment of this invention.
Figure 6:
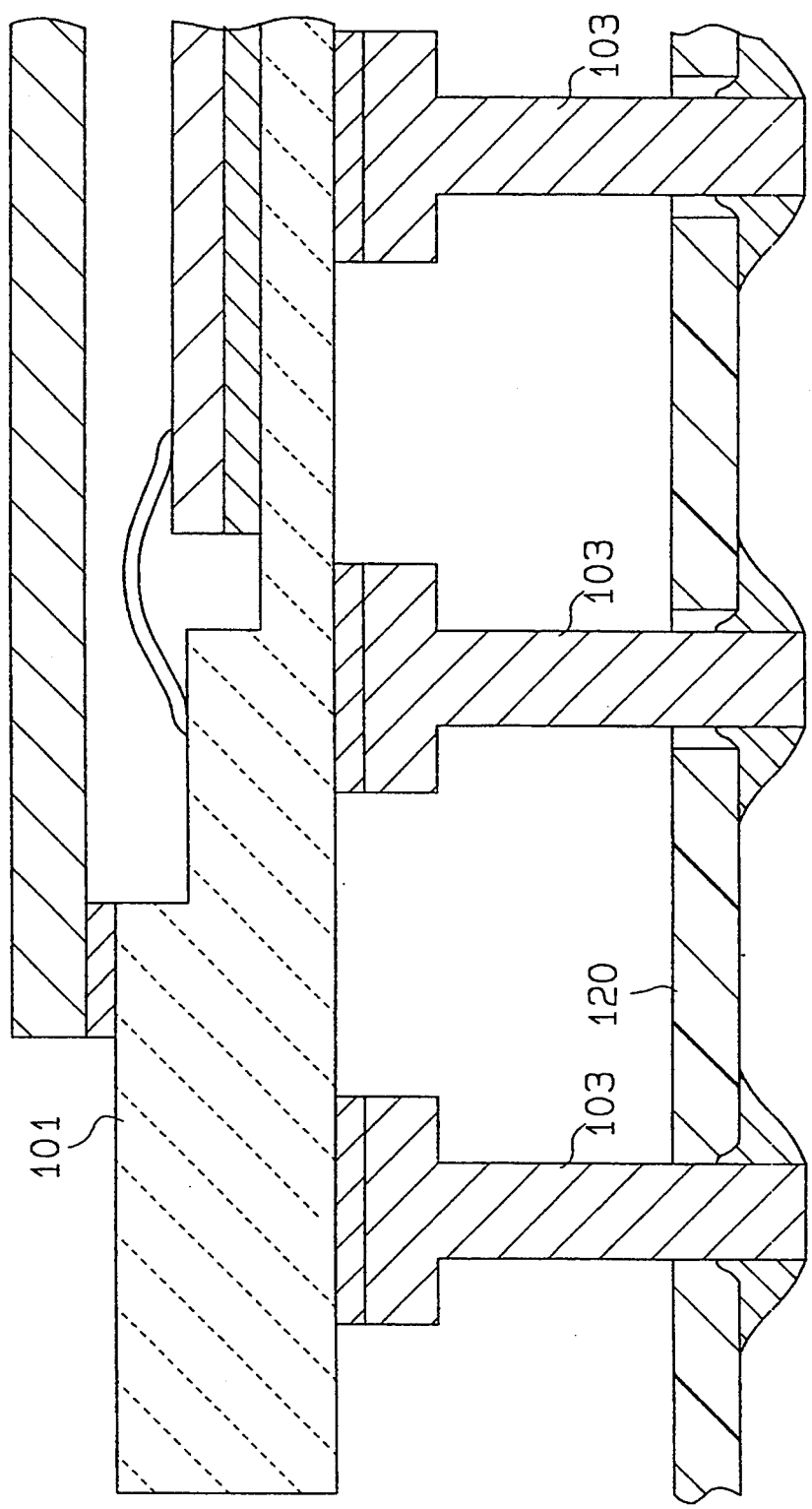
FIG. 6 is a cross section showing a conventional semiconductor device.

FIG. 5 illustrates a fourth embodiment of this invention.

In this embodiment, the lead 12 is inserted into the through hole 11 in the package 1 and is brazed to the inner wall of the hole 11. This structure allows the lead 12 to be securely attached to the package 1, preventing the lead 12 from easily being separated from the package 1. Although not shown in the diagram, the lead 12 may be provided with a flange as in the previously described embodiments. In this case, if the bottom of the flange is brazed to the top of the package 1, the separation of the lead 12 from the package 1 is prevented more effectively.

Although only four embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims. For example, the lead 12 may be attached to the bottom of the package 1. The lead 12 may have other proper shapes than a cylindrical shape, such as a C-shaped cross-section. The package 1 may be made of other materials than ceramic, such as metal and epoxy resin. The package 1 may be adapted for a PGA having a face-down structure instead of a face-up structure. In addition, this invention may be applied to semiconductor devices of other types than the PGA type, such as a DIP and QIP (Quarrel In-line Package), which have leads protruding from only one surface and being oriented in one direction.

What is claimed is:

1. A semiconductor device comprising:
   a flat semiconductor package having an upper and a lower surface and at least one through hole extending through said package interconnecting said upper and lower surfaces; and
   at least one metallic lead connector having a bore therethrough and secured to and projecting from said lower surface of said flat semiconductor package with said bore substantially coaxially aligned with said through hole for receiving a metallic conductor through said package from said upper surface for conductive connection to said lead connector.

2. The semiconductor device according to claim 1, wherein said lead connector has a flange portion which is brazed to said flat semiconductor package.

3. The semiconductor device according to claim 1, wherein said bore through said lead connector is bounded by a wall adapted to be connected to said metallic conductor by brazing.

4. The semiconductor device according to claim 1, further comprising a plurality of leads projecting from said semiconductor package and extending below said lower surface of said package substantially parallel to said lead connector for connection to a printed circuit board.

5. A semiconductor device comprising:
   a flat semiconductor package having an upper and a lower surface;
   a plurality of leads projecting from only said lower surface of said semiconductor package;
   a lead connector having a bore therethrough and secured to and projecting from said lower surface of said flat semiconductor package; and
   a guide hole formed in said semiconductor package in communication with said bore of said lead connector for guiding a wire member from another component to said bore of said connector.

6. The semiconductor device according to claim 5, wherein said lead connector has a flange portion which is brazed to said flat semiconductor package.

7. The semiconductor device according to claim 5, wherein said plurality of leads are constructed for connection to a printed circuit board.

8. A semiconductor device comprising:
   a flat semiconductor package having an upper and a lower surface with a printed circuit pattern on said lower surface;
   a plurality of leads projecting from said semiconductor package and extending from said semiconductor package for connecting said semiconductor package to a printed circuit board with said lower surface facing in close proximity said circuit board;

a lead connector in the form of a sleeve member with a longitudinal through bore for receiving a wire member from another component which wire member can be connected by brazing to the wall defining said bore; and means for joining said sleeve member to said semiconductor package for enabling said wire member to be introduced into said bore of said sleeve member from said upper surface for establishing an electric connection between a component on the upper surface side of said package with said printed circuit pattern on said lower surface.

9. The semiconductor device according to claim 8, wherein said means for joining said sleeve member to said package comprises a through hole extending through said package interconnecting said upper and lower surfaces, and said sleeve member is disposed in said hole projecting from said package at least on said lower surface side of said package and is electrically connected to said printed circuit pattern.

* * * * *